(12) United States Patent
Oohira et al.

(10) Patent No.: US 9,217,195 B2
(45) Date of Patent: Dec. 22, 2015

(54) AMORPHOUS CARBON FILM AND METHOD FOR FORMING SAME

(75) Inventors: Kouya Oohira, Mie (JP); Masaki Nakanishi, Mie (JP); Yosuke Taguchi, Mie (JP); Setsuo Nakao, Aichi (JP)

(73) Assignees: NTN CORPORATION, Osaka (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/112,885

(22) PCT Filed: Apr. 20, 2012

(86) PCT No.: PCT/JP2012/060664
§ 371 (c)(1),
(2), (4) Date: Oct. 18, 2013

(87) PCT Pub. No.: WO2012/144580
PCT Pub. Date: Oct. 26, 2012

(65) Prior Publication Data
US 2014/0030512 A1    Jan. 30, 2014

(30) Foreign Application Priority Data
Apr. 20, 2011   (JP) .................................. 2011-094444

(51) Int. Cl.
*C23C 14/06* (2006.01)
*C23C 16/26* (2006.01)
*C23C 16/515* (2006.01)

(52) U.S. Cl.
CPC ............. *C23C 14/0605* (2013.01); *C23C 16/26* (2013.01); *C23C 16/515* (2013.01); *Y10T 428/265* (2015.01)

(58) Field of Classification Search
USPC ............ 428/336, 408; 427/249.1, 249.7, 299, 427/577
See application file for complete search history.

(56) References Cited

U.S. PATENT DOCUMENTS 4,935,303 A * 6/1990 Ikoma et al. .................. 428/408
5,368,897 A   11/1994 Kurihara
(Continued)

FOREIGN PATENT DOCUMENTS

| CN | 102333968 C | 6/1995 |
| CN | 102333968 A | 1/2012 |
| DE | 3884653 T2 | 10/1988 |
| EP | 0286306 A1 | 10/1988 |
| EP | 2107135 A1 | 10/2009 |

(Continued)

OTHER PUBLICATIONS

International Search Report in Corresponding PCT Application, Dated Jul. 24, 2012.

*Primary Examiner* — Archene Turner
(74) *Attorney, Agent, or Firm* — Hedman & Costigan, P.C.; James V. Costigan; Kathleen A. Costigan

(57) ABSTRACT

The present invention provides a film formation method capable of forming a favorable amorphous carbon film under a low vacuum by using a bipolar-type PBII apparatus and the amorphous carbon film to be produced by the film formation method. The film formation method is carried out to form the amorphous carbon film under a low vacuum (1000 to 30000 Pa) by using a power source for the bipolar-type PBII apparatus. There are provided inside a chamber (1) a power source side electrode (3) connected to a power source (6) for the PBII apparatus and a grounding side electrode (4) opposed to the power source side electrode (3). A base material (2) is disposed on one of the power source side electrode (3) and the grounding side electrode (4). Plasma of a noble gas and that of a hydrocarbon-based gas are generated between the base material (2) and the electrode where the base material (2) is not disposed to form the amorphous carbon film on a surface of the base material (2).

20 Claims, 9 Drawing Sheets

(56) References Cited

U.S. PATENT DOCUMENTS

| | | | | |
|---|---|---|---|---|
| 5,403,399 | A * | 4/1995 | Kurihara et al. | 118/723 DC |
| 5,470,661 | A * | 11/1995 | Bailey et al. | 428/408 |
| 5,712,000 | A * | 1/1998 | Wei et al. | 427/577 |
| 7,160,616 | B2 * | 1/2007 | Massler et al. | 428/408 |
| 7,750,574 | B2 * | 7/2010 | Saito et al. | 118/723 E |
| 7,833,626 | B2 * | 11/2010 | Iseki et al. | 428/408 |
| 7,883,750 | B2 * | 2/2011 | Saito et al. | 427/249.1 |
| 8,821,990 | B2 * | 9/2014 | Suzuki et al. | 427/577 |
| 2004/0161534 | A1 | 8/2004 | Saito | |
| 2007/0175587 | A1 | 8/2007 | Saito | |
| 2009/0246409 | A1 | 10/2009 | Saito | |
| 2011/0311173 | A1 * | 12/2011 | Mikami et al. | 384/491 |

FOREIGN PATENT DOCUMENTS

| | | |
|---|---|---|
| JP | 64-033096 A | 2/1989 |
| JP | 2000-087218 A | 3/2000 |
| JP | 2001-011600 A | 1/2001 |
| JP | 2001-280494 A | 10/2001 |
| JP | 2002-363758 A | 12/2002 |
| JP | 2003-147526 A | 5/2003 |
| JP | 2004-217975 A | 8/2004 |
| JP | 2004-270022 A | 9/2004 |
| JP | 2006-200029 A | 8/2006 |
| JP | 2007-194110 A | 8/2007 |
| JP | 2010-196879 A | 10/2010 |
| KR | 10-1991-0006784 B | 9/1991 |
| WO | 2010/098342 A1 | 9/2010 |

* cited by examiner (a)

(b)

AMORPHOUS CARBON FILM AND METHOD FOR FORMING SAME

TECHNICAL FIELD

The present invention relates to a method for forming an amorphous carbon film under a low vacuum (about 1000 to 30000 Pa) and the amorphous carbon film obtained by the film formation method.

BACKGROUND ART

The amorphous carbon film is a rigid film called diamond-like carbon (hereinafter referred to as DLC). As the essential quality of the DLC film, the DLC film has a structure intermediate between diamond and graphite. The DLC film has a high hardness comparable to diamond and is excellent in its wear resistance, lubricity, thermal conductivity, chemical stability, and corrosion resistance. Therefore the DLC film is utilized as a protection film of dies, tools, abrasive materials, mechanical parts, and the like.

As methods for forming the amorphous carbon film (DLC film), a method to be carried out by utilizing arc discharge between carbon electrodes (see patent document 1), a cathode discharge ion plating method to be carried out by using a carbon target (see patent document 2), and an unbalanced magnetron sputtering (hereinafter referred to as UBMS) are adopted. In these methods, films are all formed under a high vacuum.

There is proposed an art of forming the amorphous carbon film (DLC film) by using a power source for a bipolar plasma-based ion implantation (hereinafter referred to as PBII) apparatus (see patent document 3). In this method, a negative voltage is applied to an electrically conductive base material in hydrocarbon plasma to deposit hydrocarbon radicals and ions on the surface thereof. In this manner, a film is formed. Positive high voltage pulses are applied to the base material to irradiate the surface layer thereof being formed with electrons in plasma at a high energy so that only the surface layer thereof is activated and has a high temperature by applying the positive high voltage pulses thereto. This method provides the amorphous carbon film excellent in its corrosion resistance and adhesiveness. In this method, toluene is used as the material gas, and the film is formed under a high vacuum having a vacuum degree of about 0.02 Pa.

PRIOR ART DOCUMENT

Patent Document

Patent document 1: Japanese Patent Application Laid-Open No. 2001-11600
Patent document 2: Japanese Patent Application Laid-Open No. 2000-87218
Patent document 3: Japanese Patent Application Laid-Open No. 2004-217975

SUMMARY OF THE INVENTION

Problem to be Solved by the Invention

But in the case of the conventional methods for forming the amorphous carbon film as disclosed in the patent documents 1 and 2, the film is formed under a high vacuum. Thus it is necessary for apparatuses for forming the amorphous carbon film to have a turbo pump or a chamber having a high sealing performance. In addition, in forming the film on large parts, it is necessary for the apparatuses for forming the amorphous carbon film to have a large vacuum chamber and a pump having a large exhaust amount to maintain a high vacuum. Thus the apparatuses are expensive.

In the case where an attempt of forming a film is made by using the apparatus of the patent document 3, by way of experiment under a low vacuum about 1000 Pa the plasma is unstably generated and thus it is difficult to form the film. Even though some attempts of forming the amorphous carbon film under a low vacuum succeeds, the obtained amorphous carbon films are inferior to a film formed under a high vacuum in the mechanical property (hardness, adhesiveness, and the like) thereof. Thus it is difficult for the apparatus to produce a high-quality DLC film excellent in its mechanical property.

The present invention has been made to cope with the above-described problems. It is an object of the present invention to provide a film formation method capable of forming a favorable amorphous carbon film under a low vacuum by using a bipolar-type PBII apparatus and the amorphous carbon film to be produced by the film formation method.

Means for Solving the Problem

A method of the present invention for forming an amorphous carbon film under a low vacuum by using a power source for a bipolar-type PBII apparatus, wherein a power source side electrode connected to the power source for the PBII apparatus and a grounding side electrode opposed to the power source side electrode are provided inside a chamber; a base material is disposed on one of the power source side electrode and the grounding side electrode; and plasma of a noble gas and that of a hydrocarbon-based gas are generated between the base material and the electrode where the base material is not disposed to form the amorphous carbon film on a surface of the base material. The degree of vacuum inside the chamber is set to 1000 to 30000 Pa. The degree of vacuum inside the chamber means the gas pressure (Pa) inside the chamber.

The hydrocarbon-based gas is introduced between the electrodes through a nozzle provided inside the chamber. The nozzle is disposed on a lateral surface disposed between the electrodes. The nozzle is disposed inside the electrode where the base material is not disposed.

The noble gas consists of at least one kind selected from among helium and argon.

The hydrocarbon-based gas consists of at least one kind selected from among methane, acetylene, and toluene. An introduction amount of the hydrocarbon-based gas is set to 1 to 50 sccm (sccm=(cc/min, 1 atm, 0° C.), the same shall apply hereafter).

The surface of the base material is subjected to ground layer formation treatment before the amorphous carbon film is formed. In the ground layer formation treatment, a metal layer is formed by carrying out vacuum batch processing.

In the ground layer formation treatment, a metal layer is formed by carrying out vacuum batch processing. The metal layer contains Cr and is formed by a UBMS method. The metal layer contains Si and is formed by using silane gas inside the chamber.

In the ground layer formation treatment, a film is formed by using polyalcohol derived from plants. The polyalcohol derived from plants is chlorogenic acid, quinic acid, gallic acid or derivatives of the chlorogenic acid, the quinic acid, and the gallic acid.

The ground layer formation treatment is Cr plating treatment, tungsten carbide spray treatment or shot peening treatment. The ground layer formation treatment is the shot peening treatment of spraying a shot material having a hardness equal to or more than that of the base material and particle diameters of 40 to 200 μm to the base material.

The base material consists of a cemented carbide material or a ferrous material.

The amorphous carbon film of the present invention is formed by carrying out the method of the present invention for forming the amorphous carbon film. The amorphous carbon film has a thickness of 0.1 to 5.0 μm.

Effect of the Invention

In the method of the present invention for forming the amorphous carbon film under a low vacuum by using the power source for the bipolar-type PBII apparatus, there are provided inside the chamber the power source side electrode connected to the power source for the PBII apparatus and the grounding side electrode opposed to the power source side electrode. The base material is disposed on one of the power source side electrode and the grounding side electrode. Plasma of a noble gas and that of a hydrocarbon-based gas are generated between the base material and the electrode where the base material is not disposed to form the amorphous carbon film on the surface of the base material. Therefore even though the degree of vacuum inside the chamber is low in the range of 1000 to 30000 Pa, the film formation method is capable of forming the amorphous carbon film. Thereby the film formation method eliminates the need for the use of a turbo pump and a chamber having a high sealing performance. Thus the film formation method allows the apparatus to have a low cost and thereby the production cost to be low. In addition the film formation method can be easily utilized to form films for large parts.

The hydrocarbon-based gas which is a material gas is introduced between the electrodes not from the outer wall of the chamber, but through the nozzle disposed at the predetermined position inside the chamber such as the lateral surface disposed between the electrodes or the insides of the electrodes. Therefore the plasma of the hydrocarbon-based gas which is the material gas can be stably generated and thus the high-quality amorphous carbon film can be formed.

Before the amorphous carbon film is formed, the metal layer containing Cr or Si is formed on the surface of the base material as a ground layer. Therefore it is possible to improve the adhesiveness of the amorphous carbon film to the surface of the base material over a case in which the metal layer is not formed on the surface thereof.

Before the amorphous carbon film is formed, as the ground layer formation treatment to be performed on the surface of the base material, film formation treatment to be carried out by using the polyalcohol compound derived from plants, the Cr plating treatment, the tungsten carbide spray treatment or the shot peening is performed. By subjecting the surface of the base material to the above-described treatments, it is possible to eliminate the need for the use of the vacuum batch processing and improve the adhesiveness of the amorphous carbon film to the surface of the base material.

The amorphous carbon film of the present invention is a hard film to be obtained by carrying out the film formation method. The amorphous carbon film of the present invention is much superior in its mechanical property (hardness, adhesiveness, and the like) to an amorphous carbon film formed in the condition to be used by a conventional film formation method except that the degree of vacuum inside the chamber is set low.

MODE FOR CARRYING OUT THE INVENTION

Figure 1:
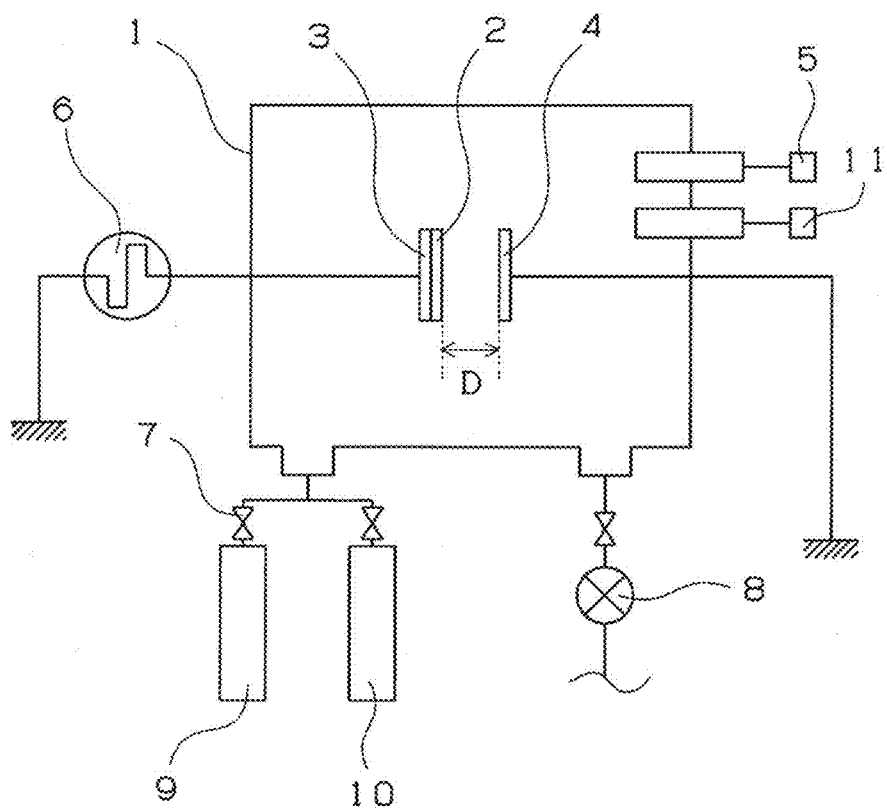
FIG. 1 is a schematic view of a film formation apparatus to be used in a film formation method of the present invention.

The method of the present invention for forming the amorphous carbon film is carried out by using a bipolar-type PBII apparatus as a film formation apparatus. The film formation mechanism of the bipolar-type PBII apparatus is described below. A positive pulse voltage is applied to a base material to accelerate electrons present in a chamber. The accelerated electrons collide with a gas and excite it or the gas is ionized into ions and electrons. The ionized electrons are accelerated by the positive pulse voltage and repeatingly collide with the gas. In this manner, the ionization occurs like avalanche, and finally a breakdown (discharge) takes place to generate plasma. Because the voltage is applied to the base material, the plasma is so formed as to enclose the base material. When the positive pulse becomes off, the plasma does not rapidly disappear, but the number of charged particles increases. After the number of the charged particles reaches the maximum, the number thereof gradually decreases. While the number thereof is gradually decreasing, a negative pulse voltage is applied to the base material. As a result, the number thereof increases again, and ions in the plasma are accelerated in an electric field and collide with the base material. As a result, the ions are implanted into the base material to form a film. Radicals in the plasma formed by applying the positive and negative pulses to the base material diffuse to the surface thereof and contribute to the film formation. Therefore the film is formed by the radicals in the plasma formed by applying the positive and negative pulses to the base material and by the ions accelerated by applying the negative pulse voltage to the base material.

In the case where the amorphous carbon film is formed by using the bipolar-type PBII apparatus, normally the amorphous carbon film is formed under a high vacuum by setting the gas pressure inside a chamber to not more than 10 Pa. By setting the gas pressure inside the chamber to such a high vacuum, it is possible to generate the plasma stably between an inner wall of the chamber and the base material to be processed and form the film by concentrating the plasma in the neighborhood of the base material.

The method of the present invention for forming the amorphous carbon film is capable of forming it not under such a high vacuum, but under a low vacuum. The condition of "under a low vacuum" means the degree of vacuum (gas pressure) at which the plasma is unstably generated in the construction in which as in the case of the above-described normal construction, only the electrode on which the base material is placed is disposed inside the chamber to generate the plasma between the inner wall of the chamber and the base material. A favorable degree of vacuum inside the chamber is a gas pressure, namely, not less than 1000 Pa which can be attained in a short period of time without using a turbo pump having a high performance. When the gas pressure becomes too high under a low vacuum close to an atmospheric pressure, it is difficult for the electrode construction of the present invention to generate the plasma. Thus the upper limit of the gas pressure is favorably less than 50000 Pa to set the degree of vacuum inside the chamber low. A more favorable range of the degree of vacuum inside the chamber is 1000 to 30000 Pa.

The film formation method of the present invention is described below with reference to FIG. 1. FIG. 1 is a schematic view of a film formation apparatus using a power source for the bipolar-type PBII apparatus which is used in the film formation method of the present invention. As shown in FIG. 1, inside the chamber 1, there are provided a power source side electrode 3 connected to the power source for the bipolar-type PBII apparatus and a grounding side electrode 4 opposed to the power source side electrode 3. A base material 2 is disposed on the power source side electrode 3. The film formation apparatus of the present invention is so constructed that the plasma is generated not between the inner wall of the chamber 1 and the base material 2, but between the base material 2 disposed on the power source side electrode 3 provided inside the chamber 1 and the opposed grounding side electrode 4 also provided inside the chamber 1 by spacing it at a predetermined interval from the power source side electrode 3 to allow the plasma of a noble gas and that of a hydrocarbon-based gas to be generated under a low vacuum. In FIG. 1, the reference numerals 5 and 11 denote a Pirani gauge and a Baratron gauge respectively.

The procedure in the film formation is described below. The hydrocarbon-based gas and the noble gas which are material gases are introduced into the chamber 1 from a material gas bomb 9 and a noble gas bomb 10 through a mass flow controller 7 respectively. It is possible to introduce the material gas through a gas introduction nozzle (see FIGS. 2 and 3) described later. The gas pressure inside the chamber 1 is adjusted to set it to a predetermined pressure by using a vacuum pump 8. The power source 6 for the bipolar-type PBII apparatus is turned on to apply the positive pulse voltage and the negative pulse voltage to the base material 2 through the power source side electrode 3. Thereby the plasma of the noble gas and that of the hydrocarbon-based gas are generated between the base material 2 and the grounding side electrode 4 to irradiate the surface of the base material 2 with the electrons in the plasmas and deposit hydrocarbon on the surface thereof.

The plasma (glow discharge) can be generated by carrying out direct-current discharge, alternating-current discharge, pulse discharge, high-frequency discharge (RF), micro-wave discharge or electron cyclotron resonance (ECR) discharge or in combination of these discharges.

As the base material 2, it is possible to use any base material without limitation, provided that the base material consists of an electrically conductive material. A base material consisting of a cemented carbide material and a base material consisting of an ferrous material are exemplified as the base material 2. As the cemented carbide material, in addition to WC—Co-based alloys whose mechanical property thereof is best of all the cemented carbide materials, it is possible to list WC—TiC—Co-based alloys, WC—TaC—Co-based alloys, WC—TiC—TaC—Co-based alloys, oxidation resistances of which are improved to use them as cutting tools. As the ferrous material, it is possible to list carbon tool steels, high-speed tool steel, alloy tool steel, stainless steel, and free-cutting steel.

The base material 2 may be disposed at any of the power source side electrode 3 and the grounding side electrode 4. As shown in FIG. 1, it is preferable to dispose the base material 2 at the power source side electrode 3, because the plasma density can be improved and ionic collision increases. The base material 2 is disposed on the power source side electrode 3 or on the grounding side electrode 4 so that the plasma can be generated between the base material 2 and the electrode on which the base material 2 is not disposed. More specifically, the base material 2 is disposed at the side of one electrode where the base material faces the other electrode on which the base material 2 is not disposed so that the base material 2 and the other electrode on which the base material 2 is not disposed are opposed to each other.

A distance D between the electrodes is the distance between the base material 2 and the electrode (In FIG. 1, the grounding side electrode 4) on which the base material 2 is not disposed. It is favorable to set the distance D between the electrodes to 1 to 20 mm and more favorable to set the distance D therebetween to 1.5 to 15 mm. There is a fear that the glow discharge which depends on the negative pulse voltage cannot be maintained when the distance D between the electrodes exceeds 20 mm. When the distance D between the electrodes is less than 1 mm, there is a fear that a short circuit occurs. By considering the negative pulse voltage, an electric field (=negative pulse voltage/distance D between electrodes, unit: "kV/cm") is set to favorably 0.5 to 20 kV, more favorably 1 to 15 kV/cm, and most favorably 5 to 10 kV/cm.

Considering an electric power (=negative pulse voltage× electric current, unit: "kW") to be applied to the base material and the area of the surface of the base material on which the film is to be formed, the density of the electric power (=electric power/film-formed area of base material, unit: "kW/cm$^2$") to be applied to the base material is set to favorably 0.5 to 10 kW/cm$^2$ and more favorably 5 to 10 kW/cm$^2$.

The configurations of the electrodes are so determined as to maintain the glow discharge. The electrode on which the base material 2 is disposed is so determined as to fixedly hold the base material 2 thereon. For example, in the forms shown in FIGS. 2 and 3, the power source side electrode 3 on which the base material 2 is disposed has an approximately cylindrical (circular plate) configuration and has a diameter equal to that of the base material 2. The grounding side electrode 4 opposed to the power source side electrode 3 has a cylindrical and stepped configuration. In the case where both electrodes are sectionally circular, the diameter of each electrode is set to favorably φ1 mm to φ30 mm and more favorably φ3 mm to φ15 mm. The larger is the diameter of the electrode, the lower is the plasma density which depends on the performance of the power source. Therefore in the case where the diameter of the electrode exceeds φ30 mm, there is a fear that an obtained film has an inferior mechanical property.

The plasma-generating noble gas is not limited to a specific kind, but it is possible to use any noble gas which generates the plasma. It is preferable to use gases consisting of at least one kind selected from among helium and argon. Of these gases, the helium gas is especially preferable because the helium gas generates the plasma easily under a low vacuum. The noble gases are introduced into the chamber 1 from the noble gas bomb 10.

As the material gas serving as a carbon supply source of the amorphous carbon film, the hydrocarbon-based gas is used. The hydrocarbon-based gas whose molecules are easily radicalizable or ionizable are preferable. Gases consisting of at least one kind selected from among methane, acetylene, and toluene are preferable. Of these gases, the methane gas is especially preferable from the standpoint of its material cost and handleability.

Figure 2:
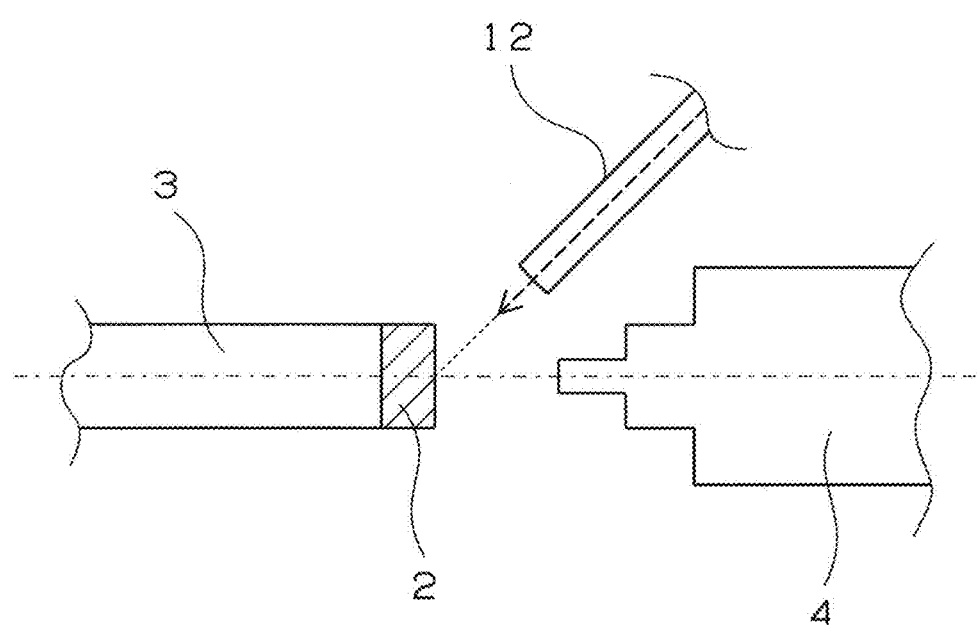
FIG. 2 shows one form of a material gas introduction nozzle.
Figure 3:
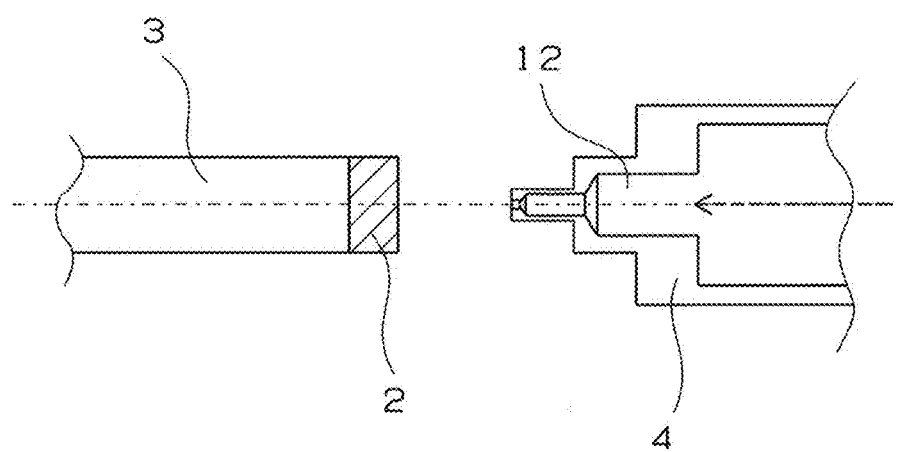
FIG. 3 shows another form of the material gas introduction nozzle.

As the material gas introduction method, it is possible to list (1) a method of introducing the material gas into the chamber (see FIG. 1), (2) a method of introducing the material gas between the electrodes from the gas introduction nozzle disposed on a lateral surface, inside the chamber, which is disposed between the electrodes (see FIG. 2), and (3) a method of introducing the material gas between the electrodes from the gas introduction nozzle disposed inside one electrode (see FIG. 3). FIGS. 2 and 3 are enlarged views of the neighborhood of the space between the electrodes in which the form of the material gas introduction nozzle is shown.

The material gas introduction method (2) is described below with reference to FIG. 2. A gas introduction nozzle 12 is located at a position, in the neighborhood of the base material 2, which is located on the lateral surface, inside the chamber, which is disposed between the power source side electrode 3 on which the base material 2 is disposed and the grounding side electrode 4. The black arrow in FIG. 2 shows the gas introduction direction. The gas introduction nozzle 12 is provided by inclining it relative to the direction in which the power source side electrode 3 and the grounding side electrode 4 are opposed to each other. As shown in FIG. 2, by inclining the gas introduction nozzle 12 relative to the base material 2, it is possible to introduce the material gas toward the surface of the base material 2 on which the film is to be formed and thereby improve film formation efficiency. It is possible to select the inclination angle and position (distance between electrodes) of the gas introduction nozzle 12 in a range in which the material gas can be introduced between the electrodes. The gas introduction nozzle 12 is constructed of an insulator to prevent discharge between the electrodes from being interrupted. The gas introduction nozzle 12 is connected with the material gas bomb 9 disposed outside the chamber.

The material gas introduction method (3) is described below with reference to FIG. 3. The gas introduction nozzle 12 is disposed inside the grounding side electrode 4 on which the base material 2 is not disposed. In the form shown in FIG. 3, the gas introduction nozzle 12 is formed as a material gas flow channel (through-hole) formed inside the electrode 4. The front end of the gas introduction nozzle 12 is positioned at an end surface of the grounding side electrode 4 opposed to the power source side electrode 3. The black arrow in FIG. 3 shows the gas introduction direction. As shown in FIG. 3, by disposing the gas introduction nozzle 12 inside the electrode, it is possible to introduce the material gas toward the surface of the base material 2, opposed to the grounding side electrode 4, on which the film is to be formed and thereby improve the film formation efficiency. As in the case of the material gas introduction method (2), the gas introduction nozzle 12 is connected with the material gas bomb 9 disposed outside the chamber.

In the case of the material gas introduction method (1), the film can be formed when conditions are favorable, e.g. when the distance between the electrodes is short and the like. To form a high-quality amorphous carbon film under a low vacuum, the material gas introduction methods (2) and (3) are more favorable than the material gas introduction method (1). By introducing the material gas into the chamber not directly, but by introducing the material gas into the neighborhood of a portion of the chamber disposed between the electrodes through the nozzle disposed inside the chamber, the concentration of the material gas becomes locally high in the neighborhood of the portion of the chamber disposed between the electrodes. Thereby the plasma of the material gas can be stably generated. Consequently it is possible to improve the formation speed of the film and the mechanical property thereof.

The introduction amount (flow rate) of the material gas is set to favorably 0.5 to 50 sccm and more favorably 1 to 50 sccm. In the case where the introduction amount of the material gas is less than 0.5 sccm or more than 50 sccm, there is a fear that the obtained film has an inferior mechanical property.

To stably generate the plasma under a low vacuum, in the method of the present invention for forming the amorphous carbon film, the above-described configurations are used for the electrodes (opposed electrodes). To improve the mechanical property (hardness, adhesiveness, and the like) of the amorphous carbon film to be obtained under a low vacuum, the above-described material gas supply method, configurations of the electrodes, kind of each plasma-generating gas, and kind of each material gas, and flow rate of each material gas are optimized. In the method of the present invention for forming the amorphous carbon film, it is possible to appropriately adopt the known condition and procedure to be used in the case where the bipolar-type PBII apparatus is used as a film formation condition and a procedure other than those described above.

It is preferable to form a metal layer as a ground layer on the surface of the base material before the amorphous carbon film is formed. The formation of the metal layer improves the adhesiveness of the amorphous carbon film to the base material over a case in which the metal layer is not formed. To improve the adhesiveness of the metal layer to the base material, it is preferable for a metal material composing the metal layer to contain not less than one kind of a metal selected from among Cr, Al, W, Ta, Mo, Nb, Si, and Ti compatible with the base material in the case where the cemented carbide material or the ferrous material is used as the base material. Cr and Si are more favorable than the other metals.

As the method for forming the metal layer, it is possible to adopt a CVD method, a PVD method, and other known methods. In the case where firm adhesiveness of the metal layer to the base material is necessary, it is preferable to form the metal layer by carrying out vacuum batch processing under a high vacuum. As the vacuum batch processing, it is preferable to use a UBMS method. By forming the film by using a Cr target in a UBMS apparatus, it is possible to form the metal layer containing Cr on the surface of the base material.

In the case where the base material consists of a ferrous material, the base material and the Cr-containing metal layer which is the ground layer are highly adhesive to each other. The metal layer and the amorphous carbon film have a small difference in the hardnesses thereof and are thus highly adhesive to each other. Consequently the amorphous carbon film has a high adhesiveness to the base material and is thus unlikely to peel therefrom.

In the case where the ferrous material is used as the base material, to enhance the adhesiveness between the base material and the metal layer, the surface of the base material can be subjected to nitriding treatment before the metal layer is formed. As the nitriding treatment, it is preferable to subject the surface of the base material to plasma nitriding treatment because an oxidized layer which prevents the metal layer from firmly adhering to the base material is unlikely to be formed on the surface of the base material.

As another example of the metal layer, it is possible to form the metal layer containing Si by using silane gas such as tetramethylsilane as the material gas instead of the hydrocarbon-based gas in the film formation apparatus shown in FIG.

1. In this case, it is possible to form the metal layer and the amorphous carbon film in the same apparatus. Thus the production cost can be less expensive than a case where the metal layer is formed by using a different apparatus.

To improve the adhesiveness between the base material and the amorphous carbon film, it is possible to subject the surface of the base material to ground layer formation treatment before the amorphous carbon film is formed. The ground layer formation treatment which can be accomplished in an atmospheric pressure is preferable. For example, it is possible to adopt the film formation treatment to be carried out by using a polyalcohol compound derived from plants, Cr plating treatment, tungsten carbide spray treatment, and shot peening treatment. By subjecting the surface of the base material to the above-described treatments instead of the vacuum batch processing (formation of metal layer), a sequence of processings for forming the amorphous carbon film can be performed under a low vacuum. The above-described Cr plating treatment is performed to form the metal layer containing Cr by carrying out an electroplating method.

The treatment of forming the film by using the polyalcohol compound derived from plants is not limited to a specific one, but it is possible to use any type of treatment, provided that by performing the treatment, the film is formed on the surface of the base material owing to the action of the polyalcohol compound. As the film treatment method, it is possible to adopt a method of forming a (oxidized) film on the surface of the base material by immersing the base material in a treating liquid in which the polyalcohol compound derived from plants is dispersed or dissolved in water and/or an organic solvent. To form the film quickly, it is preferable to heat the treating liquid in carrying out this method.

As the polyalcohol compound derived from plants, gallic acid, ellagic acid, chlorogenic acid, caffeic acid, quinic acid, curcumin, quercetin, pyrogallol, theaflavin, anthocyanin, rutin, lignan, and catechin are listed. It is also possible to use polyalcohol compounds such as sesamin, isoflavone, and coumarin derived from plants. The above-described polyalcohol compounds may be used singly or in combination of not less than two kinds thereof. It is possible to decrease the degree of an environmental load by using these polyalcohol compounds derived from plants.

Of these polyalcohol compounds derived from plants, it is preferable to use the gallic acid or derivatives thereof, the chlorogenic acid or derivatives thereof, and the quinic acid or derivatives thereof because in treating the film, the oxidized film can be easily formed on the surface of the base material owing to the use of these polyalcohol compounds.

The gallic acid which can be used in the present invention is a polyalcohol compound contained in Japanese sumac and tea leaves and has a structure shown by a formula (1) shown below. As derivatives of the gallic acid, gallic acid ester such as methyl gallate, ethyl gallate, propyl gallate, butyl gallate, pentyl gallate, hexyl gallate, heptyl gallate, and octyl gallate; and gallate such as bismuth gallate are listed.

[Chemical formula 1]

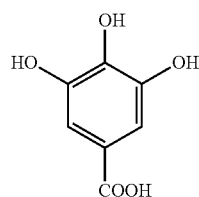

(1)

The chlorogenic acid which can be used in the present invention is a polyalcohol compound contained in coffee beans and the like and has a structure shown by a formula (2) shown below. The quinic acid is the polyalcohol compound to be obtained by hydrolysis of the chlorogenic acid and has a structure shown by a formula (3) shown below.

[Chemical formula 2]

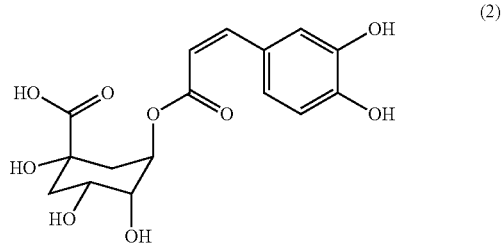

(2)

[Chemical formula 3]

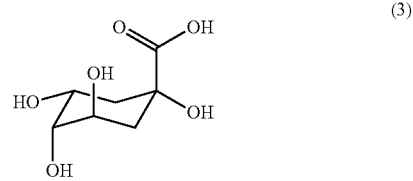

(3)

In the tungsten carbide thermal spray treatment, tungsten carbide (WC) is used as a material to be thermally sprayed. As the thermal spraying method, it is possible to adopt known thermal spraying methods such as flame thermal spray, arc thermal spray, plasma thermal spray, and laser thermal spray. By performing the thermal spraying treatment, a thermally sprayed film is formed on the surface of the base material. A large number of particles having different diameters are fused to each other in only the surface layers thereof to form the thermally sprayed film. In the thermally sprayed film, pores and voids are generated at boundaries between particles to form the porous thermally sprayed film.

As the shot peening treatment, it is preferable to perform treatment (so-called WPC treatment) of spraying a shot material having a hardness equal to or more than that of the base material and particle diameters of 40 to 200 μm to the base material. The injection velocity is set to favorably not less than 10 m/second and more favorably not less than 100 m/second. In this treatment, the surface of the base material is heated and cooled rapidly, instantaneously, and repeatedly up to a temperature region not less than a transformation point A3. Owing to the effect of this heat treatment, re-crystallization and refinement of crystal grains are performed to allow the texture of the surface of the base material to have hardness and toughness to a higher extent. Thereby it is possible to improve the strength and fatigue strength of the surface of the base material. Further, smooth and fine irregularities are formed on the heat-treated surface of the base material.

It is preferable to set the surface roughness Ra of the base material on which the amorphous carbon film is to be formed to a range of 0.01 to 0.30 μm. In the case where the film is formed on the surface of the base material by the ground layer formation treatment, the surface roughness Ra of the base material on which the amorphous carbon film is to be formed is the surface roughness of the film formed on the surface of the base material. When the surface roughness Ra is less than 0.01 μm, it is difficult to form projections on the surface of the base material (or metal layer). Thereby it is impossible to expect the adhesion between the amorphous carbon film and the surface of the base material (or metal layer) to be improved by anchor effect. When the surface roughness Ra is more than 0.30 µm, a stress concentrates on the projections formed on the surface of the base material (or metal layer). Thus there is a fear that the adhesiveness of the amorphous carbon film to the surface of the base material (or metal layer) is inhibited.

In forming the amorphous carbon film, it is preferable to provide the base material (or metal layer) side of the amorphous carbon film with a hardness-inclined portion in which the hardness of the amorphous carbon film becomes higher successively or stepwise from the base material (or metal layer) side of the amorphous carbon film. The hardness-inclined portion is obtained by changing the negative pulse voltage successively or stepwise. The reason the hardness of the amorphous carbon film becomes higher successively or stepwise is because in the component ratio between the graphite structure and the diamond structure in the DLC structure of the amorphous carbon film, the ratio of the diamond structure becomes higher owing to a rise of the voltage. Thereby it is possible to decrease the difference between the hardness of the base material (or metal layer) and that of the amorphous carbon film and thus the base material (or metal layer) and the amorphous carbon film are adhesive to each other to a higher extent.

The amorphous carbon film of the present invention is a hard film (DLC) to be obtained by the above-described film formation method. The amorphous carbon film of the present invention is superior in its mechanical property (hardness, adhesiveness, and the like) to an amorphous carbon film formed in the condition to be used by a conventional film formation method except that the degree of vacuum inside the chamber is set low. As shown in the examples described later, the amorphous carbon film of the present invention has a structure close to that of the amorphous carbon film obtained by using a UBMS method to be carried out under a high vacuum. The amorphous carbon film of the present invention can be thickened to 0.1 to 5.0 µm without peeling it from the surface of the base material and crackling it.

EXAMPLES

Although the present invention is further described below by way of examples, the scope of the present invention is not limited thereby.

Examples 1 Through 17, Comparative Examples 1 and 2, and Reference Examples 1 Through 15

By using the film formation apparatus shown in FIG. 1, the amorphous carbon film was formed on the base material 2. The base material 2 had a diameter equal to those of the power source side electrodes 3 shown in tables and a thickness of 8 mm. The base material 2 consists of SUJ2 (750 Hv) and had a surface roughness R of 0.005 µm. The base material 2 was fastened to the power source side electrode 3 with a bolt to integrate them with each other.

The material gas (hydrocarbon-based gas) and the plasma-generating gas (noble gas) were introduced from the material gas bomb 9 and the noble gas bomb 10 respectively into the chamber 1 through the mass flow controller 7. The material gas was introduced into the chamber 1 by using the supply methods shown in the tables. The gas introduction amount of each material gas is as shown in the tables. In the gas supply methods shown in the tables, "lateral surface", "electrode", and "chamber" shown in the tables have the mode shown in FIG. 2, FIG. 3, and FIG. 1 respectively. The gas pressures inside the chamber 1 were so adjusted as to attain the pressures shown in the tables by using the vacuum pump 8. The power source 6 for the PBII apparatus was turned on to apply the positive pulse voltage (voltage: 0.7 kV, frequency: 4 kHz, pulse width: 0.25 µs) and the negative pulse voltage (voltages are shown in the tables, frequency: 4 kHz, pulse width: 1 µs) to the base material 2 through the power source side electrode 3. Other conditions are as shown in the tables. Thereby the plasma of the noble gas and that of the hydrocarbon-based gas were generated between the base material 2 and the grounding side electrode 4 to form the amorphous carbon film on the surface of the base material 2.

Regarding the metal layer formed on the surface of the base material as the ground layer, the metal layers shown in the tables were formed before the amorphous carbon film was formed on the surfaces thereof. The metal layer consisting of Cr was formed by using the UBMS apparatus (UBMS202/AIP combined apparatus produced by Kobe Steel, Ltd.). More specifically, the gas inside the chamber was vacuum drawn to set the gas pressure inside the chamber to about $5 \times 10^{-3}$ Pa. After the base material was baked by a heater, the surface of the base material was etched by Ar plasma. Thereafter the metal layer consisting of Cr was formed by using a Cr target. The metal layer consisting of Si was formed under a high vacuum (0.2 Pa) by using the film formation apparatus, shown in FIG. 1, in which helium gas was used as the plasma-generating gas, and silane gas was used as the material gas.

The thickness of each of the obtained amorphous carbon films was measured, and Raman spectroscopic measurement thereof was conducted.

<Measurement of Film Thickness>

The thickness of each of the obtained amorphous carbon films (metal layer was not contained) was measured by using a surface configuration/surface roughness measuring instrument (Form Talysurf PGI830 produced by Taylor Hobson Inc.). To determine the thickness of each amorphous carbon film, a portion of a film-formed part was masked to compute the difference in level between a film-unformed part and the film-formed part.

TABLE 1

| Example | Pressure (Pa) | Gas for generating plasma | Material gas | Material gas introduction amount (sccm) | Gas supply method | Metal surface | Film thickness (µm) |
|---|---|---|---|---|---|---|---|
| 1 | 5000 | He | $CH_4$ | 1 | Lateral surface ① | Cr | 0.5 |
| 2 | 5000 | He | $CH_4$ | 10 | Lateral surface ① | Cr | 0.7 |
| 3 | 5000 | He | $CH_4$ | 50 | Lateral surface ① | Cr | 1.5 |
| 4 | 5000 | He | $CH_4$ | 1 | Lateral surface ① | Cr | 0.4 |
| 5 | 5000 | He | $CH_4$ | 10 | Lateral surface ① | Cr | 0.6 |
| 6 | 5000 | He | $CH_4$ | 50 | Lateral surface ① | Cr | 1.3 |
| 7 | 5000 | He/Ar (2%) | $CH_4$ | 50 | Lateral surface ① | Cr | 0.6 |
| 8 | 5000 | He | $C_2H_2$ | 50 | Lateral surface ① | Cr | 0.9 |
| 9 | 5000 | He | $C_2H_2$ | 50 | Lateral surface ① | Cr | 0.6 |

TABLE 1-continued

| Example | Pressure (Pa) | Gas for generating plasma | Material gas | Material gas introduction amount (sccm) | Gas supply method | Metal surface | Film thickness (μm) |
|---|---|---|---|---|---|---|---|
| 10 | 5000 | He | $C_2H_2$ | 50 | Electrode ② | Cr | 0.6 |
| 11 | 5000 | He | $C_2H_2$ | 50 | Chamber ③ | Cr | 0.3 |
| 12 | 5000 | He | $C_7H_8$ | 50 | Lateral surface ① | Cr | 1.1 |
| 13 | 5000 | He | $CH_4$ | 50 | Lateral surface ① | — | 0.6 |
| 14 | 5000 | He | $CH_4$ | 50 | Lateral surface ① | Si | 0.5 |
| 15 | 1000 | He | $CH_4$ | 50 | Lateral surface ① | Cr | 0.4 |
| 16 | 10000 | He | $CH_4$ | 50 | Lateral surface ① | Cr | 1 |
| 17 | 30000 | He | $CH_4$ | 50 | Lateral surface ① | Cr | 1.4 |

TABLE 2

| Example | Negative pulse Voltage (kV) | Electric power (kW) | Electric field (kV/cm) | Density of supplied electric power (kW/cm$^2$) | Configuration of electrode Distance between electrodes (mm) | Power source side | Grounding side |
|---|---|---|---|---|---|---|---|
| 1 | 1 | 10 | 6.67 | 5.66 | 1.5 | φ15 | φ15 |
| 2 | 1 | 10 | 6.67 | 5.66 | 1.5 | φ15 | φ15 |
| 3 | 1 | 10 | 6.67 | 5.66 | 1.5 | φ15 | φ15 |
| 4 | 1.5 | 15 | 10 | 8.50 | 1.5 | φ15 | φ15 |
| 5 | 1.5 | 15 | 10 | 8.50 | 1.5 | φ15 | φ15 |
| 6 | 1.5 | 15 | 10 | 8.50 | 1.5 | φ15 | φ15 |
| 7 | 1.5 | 15 | 10 | 8.50 | 1.5 | φ15 | φ15 |
| 8 | 1.5 | 15 | 10 | 8.50 | 1.5 | φ15 | φ15 |
| 9 | 1.5 | 15 | 10 | 8.50 | 1.5 | φ15 | φ15 |
| 10 | 1.5 | 15 | 10 | 8.50 | 1.5 | φ15 | φ15 |
| 11 | 1.5 | 15 | 10 | 8.50 | 1.5 | φ15 | φ15 |
| 12 | 1.5 | 15 | 10 | 8.50 | 1.5 | φ15 | φ15 |
| 13 | 1.5 | 15 | 10 | 8.50 | 1.5 | φ15 | φ15 |
| 14 | 1.5 | 15 | 10 | 8.50 | 1.5 | φ15 | φ15 |
| 15 | 1.5 | 15 | 10 | 8.50 | 1.5 | φ15 | φ15 |
| 16 | 1.5 | 15 | 10 | 8.50 | 1.5 | φ15 | φ15 |
| 17 | 1.5 | 15 | 10 | 8.50 | 1.5 | φ15 | φ15 |

TABLE 3

| Comparative example | Pressure (Pa) | Gas for generating plasma | Material gas | Material gas introduction amount (sccm) | Gas supply method | Metal surface | Film thickness (μm) |
|---|---|---|---|---|---|---|---|
| 1 | 50000 | He | $CH_4$ | 1 | Lateral surface ① | Cr | — |
| 2 | 5000 | $N_2$ | $CH_4$ | 1 | Lateral surface ① | Cr | — |

TABLE 4

| Comparative example | Negative pulse Voltage (kV) | Electric power (kW) | Electric field (kV/cm) | Density of supplied electric power (kW/cm$^2$) | Configuration of electrode Distance between electrodes (mm) | Power source side | Grounding side |
|---|---|---|---|---|---|---|---|
| 1 | 1 | 10 | 6.67 | 5.66 | 1.5 | φ15 | φ15 |
| 2 | 0.6 | 6 | 4 | 3.39 | 1.5 | φ15 | φ15 |

TABLE 5

| Reference example | Pressure (Pa) | Gas for generating plasma | Material gas | Material gas introduction amount (sccm) | Gas supply method | Metal surface | Film thickness (μm) |
|---|---|---|---|---|---|---|---|
| 1 | 5000 | He | $CH_4$ | 1 | Electrode ② | Cr | 0.6 |
| 2 | 5000 | He | $CH_4$ | 10 | Electrode ② | Cr | 0.8 |
| 3 | 5000 | He | $CH_4$ | 1 | Chamber ③ | Cr | 0.3 |
| 4 | 5000 | He | $CH_4$ | 10 | Chamber ③ | Cr | 0.4 |
| 5 | 5000 | He | $CH_4$ | 1 | Lateral surface ① | Cr | 0.2 |
| 6 | 5000 | He | $CH_4$ | 1 | Lateral surface ① | Cr | 0.15 |
| 7 | 5000 | He | $CH_4$ | 10 | Lateral surface ① | Cr | 0.8 |
| 8 | 5000 | He | $CH_4$ | 10 | Lateral surface ① | Cr | 0.7 |

TABLE 5-continued

| Reference example | Pressure (Pa) | Gas for generating plasma | Material gas | Material gas introduction amount (sccm) | Gas supply method | Metal surface | Film thickness (μm) |
|---|---|---|---|---|---|---|---|
| 9 | 5000 | He | CH₄ | 70 | Lateral surface ① | Cr | 1.8 |
| 10 | 5000 | He | CH₄ | 0.1 | Lateral surface ① | Cr | 0.1 |
| 11 | 5000 | He | CH₄ | 10 | Lateral surface ① | Cr | 0.6 |
| 12 | 5000 | Ar | CH₄ | 10 | Lateral surface ① | Cr | 0.3 |
| 13 | 5000 | He | CH₄ | 10 | Lateral surface ① | Cr | 0.6 |
| 14 | 5000 | He | CH₄ | 10 | Lateral surface ① | Cr | 0.5 |
| 15 | 1000 | He | CH₄ | 10 | Lateral surface ① | Cr | 0.5 |

TABLE 6

| Reference example | Negative pulse Voltage (kV) | Electric power (kW) | Electric field (kV/cm) | Density of supplied electric power (kW/cm²) | Configuration of electrode | | |
|---|---|---|---|---|---|---|---|
| | | | | | Distance between electrodes (mm) | Power source side | Grounding side |
| 1 | 1 | 10 | 6.67 | 5.66 | 1.5 | φ15 | φ15 |
| 2 | 1 | 10 | 6.67 | 5.66 | 1.5 | φ15 | φ15 |
| 3 | 1 | 10 | 6.67 | 5.66 | 1.5 | φ15 | φ15 |
| 4 | 1 | 10 | 6.67 | 5.66 | 1.5 | φ15 | φ15 |
| 5 | 0.6 | 6 | 4 | 3.39 | 1.5 | φ15 | φ15 |
| 6 | 0.8 | 8 | 5.33 | 4.53 | 1.5 | φ15 | φ15 |
| 7 | 1 | 10 | 0.50 | 5.66 | 20 | φ15 | φ15 |
| 8 | 1 | 10 | 6.67 | 0.79 | 1.5 | φ40 | φ15 |
| 9 | 1 | 10 | 6.67 | 3.78 | 1.5 | φ15 | φ15 |
| 10 | 1 | 10 | 6.67 | 3.78 | 1.5 | φ15 | φ15 |
| 11 | 1 | 10 | 6.67 | 3.78 | 1.5 | φ15 | φ20 |
| 12 | 1.5 | 15 | 10 | 8.50 | 1.5 | φ15 | φ15 |
| 13 | 1.5 | 15 | 3 | 8.50 | 5 | φ15 | φ15 |
| 14 | 1.5 | 15 | 1 | 8.50 | 15 | φ15 | φ15 |
| 15 | 1.5 | 15 | 10 | 2.12 | 1.5 | φ30 | φ5 |

<Raman Spectrometry>

Figure 4:
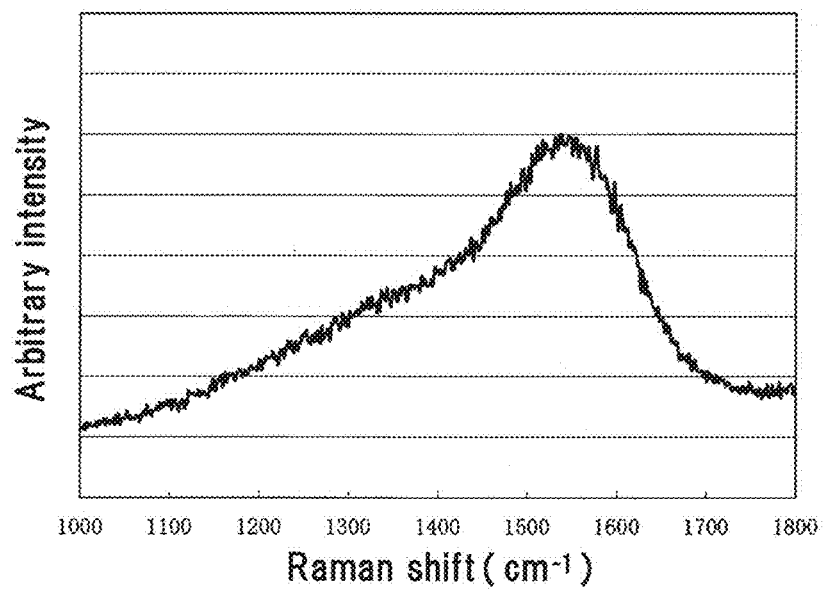
FIG. 4 shows Raman spectrum of an amorphous carbon film of an example 1.
Figure 5:
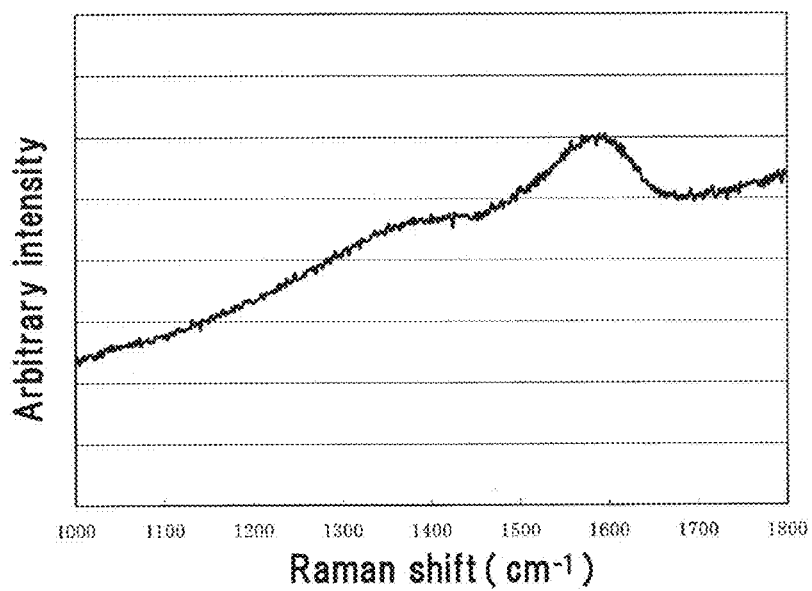
FIG. 5 shows Raman spectrum of an amorphous carbon film of a comparative example 1.
Figure 6:
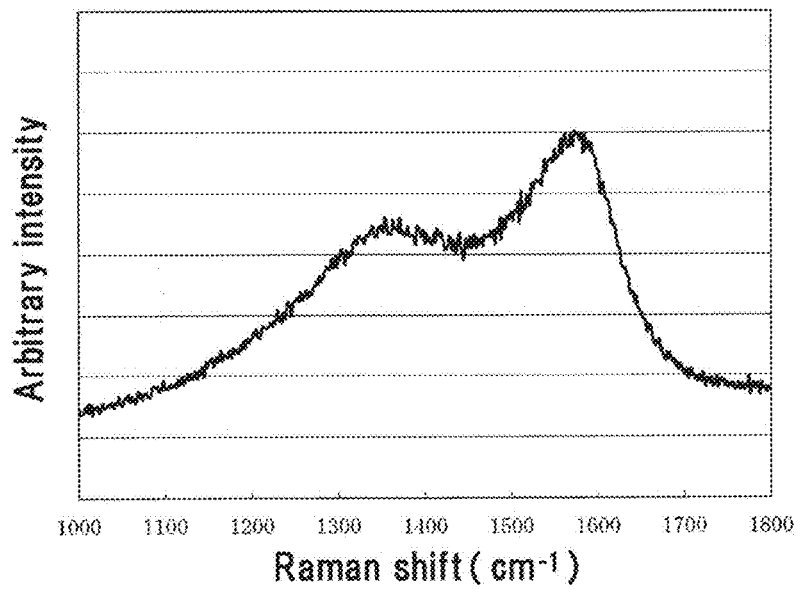
FIG. 6 shows Raman spectrum of an amorphous carbon film of a reference example 3.
Figure 7:
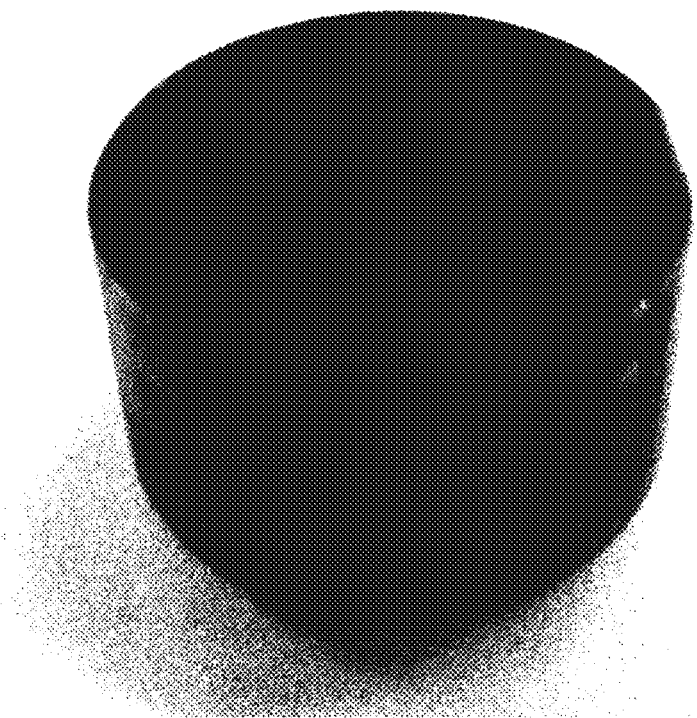
FIG. 7 is a photograph of the outside appearance of the amorphous carbon film of the example 1.
Figure 8:
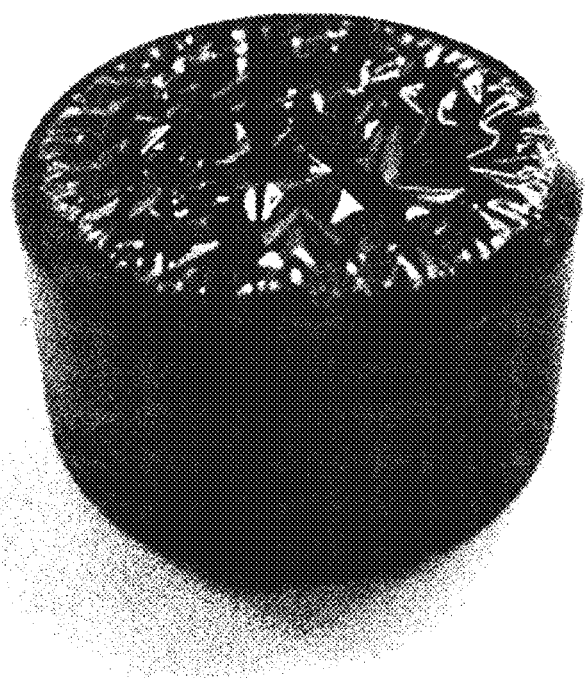
FIG. 8 is a photograph of the outside appearance of the amorphous carbon film of the comparative example 1.
Figure 9:
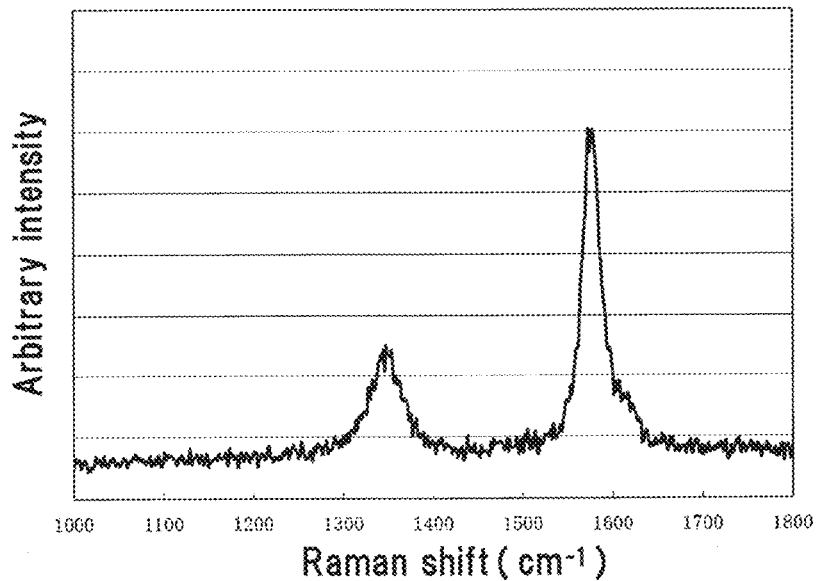
FIG. 9 shows Raman spectrum of graphite and that of an amorphous carbon film obtained by using a UBMS method.
Figure 9:
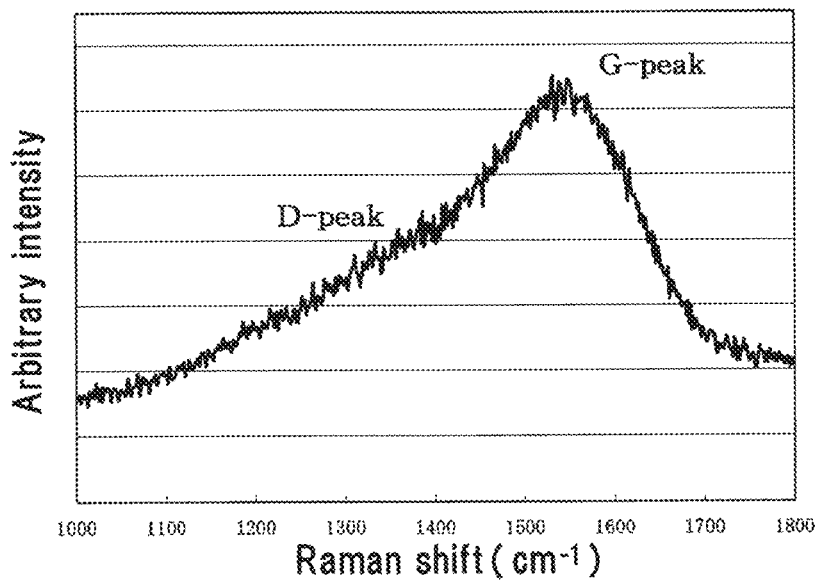

The amorphous carbon film having the DLC structure can be separated into the peak G in the neighborhood of 1580 cm$^{-1}$ derived from the graphite structure and the peak D in the neighborhood of 1400 cm$^{-1}$ derived from the irregular structure of the sp$^2$ hybrid orbital disordered structure (see FIG. 9(b)). The Raman spectroscopic measurement of the obtained amorphous carbon films was conducted by using a Raman spectroscopic measurement apparatus (micro-Raman spectroscopic instrument inVia produced by Renishaw Inc.). The results of the example 1, the comparative example 1, and the reference 3 are shown in FIG. 4, FIG. 5, and FIG. 6 respectively. FIG. 7 shows the photograph of the outside appearance of the amorphous carbon film of the example 1. FIG. 8 shows the photograph of the outside appearance of the amorphous carbon film of the comparative example 1.

As a reference, FIG. 9(a) shows the Raman spectrum of graphite. FIG. 9(b) shows the Raman spectrum of the amorphous carbon film (DLC) obtained under a high vacuum by using the UBMS method. The larger is the inclination of the background, the higher is a polymer component. As the peak intensity ratio (D/G) increases, graphitization (existence probability of sp$^2$ structure increases) proceeds.

The amorphous carbon films formed on the surface of the base material in the conditions of the examples had a preferable (not peeled from the surface thereof) outside appearance and were close to a waveform shown in the amorphous carbon film of the example 1 in the Raman spectra thereof. Because the waveforms of the amorphous carbon films formed in the conditions of the example 1 were close to that of the amorphous carbon film obtained under a high vacuum by using the UBMS method, it can be expected that amorphous carbon films formed in the conditions of the example 1 are as excellent as the amorphous carbon film obtained under a high vacuum by using the UBMS method in the mechanical properties thereof.

The amorphous carbon films formed on the surface of the base material in the conditions of the reference examples were a little inferior to the amorphous carbon films of the examples. The amorphous carbon film of the comparative example 1 had an outside appearance as shown in FIG. 8 and was polymer-like. In the amorphous carbon film of the comparative example 2, N$_2$ was used as the plasma-generating gas. A plasma state could not be stably maintained at 5000 Pa. Thus the amorphous carbon film of the comparative example 2 was unfavorable in its quality.

The influence given to the adhesiveness of the amorphous carbon film by the ground layer formation treatment performed on the base material was examined.

Examples 18 Through 20

Surface Treatment Using Natural Antioxidant

The polyalcohol compound (chlorogenic acid, quinic acid, and gallic acid (produced by Tokyo Chemical Industry Co., Ltd.)) derived from plants was dissolved in water. The concentration of the solution was set to 0.5 wt % to prepare a treating liquid. As pre-treatment, after the base material shown in table 7 was cleaned with 50 wt % of hydrochloric acid, the treating liquid was stirred at a room temperature for four hours with the base material being immersed in the treating liquid to form a film on the entire surface of the base material. The amorphous carbon film was formed on the surface of the base material in the same condition as that of the example 2 except for the ground layer.

Example 21

Cr Plating Treatment

After the base material shown in table 7 was immersed in a plating bath and etched, a positive electric charge was flowed through the plating solution to deposit Cr plating on the surface thereof. After the plating operation finished, a chromium solution which attached to the surface of the base material was washed away to dry the surface thereof. The amorphous carbon film was formed on the surface of the base material in the same condition as that of the example 2 except the ground layer.

Example 22

WPC Treatment

A shot material having a hardness equal to or more than that of the base material and particle diameters of 40 to 200 μm was sprayed to the surface of the base material shown in FIG. 7 at an injection pressure of about 0.3 MPa (injection velocity: about 10 m/s). The amorphous carbon film was formed on the surface of the base material in the same condition as that of the example 2 except the ground layer.

Example 23

WC Thermal Spraying Treatment

WC was fused and sprayed to the surface of the base material shown in FIG. 7 by using a high-temperature plasma jet having a temperature not less than 10000° C. The amorphous carbon film was formed on the surface of the base material in the same condition as that of the example 2 except the ground layer.

Example 24

Non-Formation of Ground Layer

The amorphous carbon film was formed on the surface of the base material in the same condition as that of the example 2 except the ground layer. The ground layer was not formed on the surface of the base material.

Example 25

CrWC

A CrWC film was formed on the surface of the base material shown in table 7 by using the UBMS apparatus (UBMS202/AIP combined apparatus produced by Kobe Steel, Ltd.). More specifically, the gas inside the chamber was vacuum drawn to set the gas pressure inside the chamber to about $5 \times 10^{-3}$ Pa. After the base material was baked by a heater, the surface thereof was etched with Ar plasma. Thereafter a sputter electric power to be applied to the Cr target and a WC target was adjusted to form a layer in which the composition ratio between Cr and WC was inclined. The amorphous carbon film was formed on the surface of the base material in the same condition as that of the example 2 except the ground layer.

Example 26

WPC Treatment

A shot material having a hardness equal to or more than that of the base material and particle diameters of 40 to 200 μm was sprayed to the surface of the base material shown in FIG. 7 at an injection pressure of about 1.0 MPa (injection velocity: about 100 m/s). In the spraying operation, the surface roughness Ra was adjusted so that it became 0.5 μm. The amorphous carbon film was formed on the surface of the base material in the same condition as that of the example 2 except the ground layer.

The surface roughness of the base material (or the surface of the film formed on the surface of the base material by ground layer formation treatment) of each of the examples 18 through 26 was measured by using a Mitutoyo surface roughness tester CS-H5000CNC before the amorphous carbon film was formed thereon. Table 7 shows the results. The surface roughness is shown by Ra (arithmetic mean roughness). A scratch test shown below was conducted on the obtained amorphous carbon films to evaluate the adhesiveness thereof to the surface of the base material. Table 7 shows the results.

Scratch Test

A scratch test was conducted on each of the obtained amorphous carbon films by using a Revetest RST produced by Nanotech, Inc. to measure the critical separation load thereof. More specifically, a test was conducted on each base material having the amorphous carbon film formed on the surface thereof at a scratch speed of 10 mm/minute and a load-applied speed of 10N/mm (load was successively increased) by using a diamond indenter having a diameter of 2000 μm at its front end. Judgment was made by watching the screen of a tester. A load applied to the base material when an exposed area of the base material reached 50% with respect to a friction mark (length in friction direction: 375 μm, width: about 100 μm) on the screen was measured as the critical separation load.

TABLE 7

|  | Example | | | | | | | | |
| --- | --- | --- | --- | --- | --- | --- | --- | --- | --- |
|  | 18 | 19 | 20 | 21 | 22 | 23 | 24 | 25 | 26 |
| Base material | SUJ2 | SUJ2 | SUJ2 | SUJ2 | SUJ2 | SUJ2 | SUJ2 | SUJ2 | SUJ2 |
| Hardness of base material (HV) | 750 | 750 | 750 | 750 | 750 | 750 | 750 | 750 | 750 |
| Surface roughness of base material (μmRa) | 0.15 | 0.20 | 0.10 | 0.10 | 0.10 | 0.05 | 0.005 | 0.008 | 0.50 |
| Ground layer formation treatment | Chlorogenic acid | Quinic acid | Gallic acid | Cr plating | — | WC thermal spray | — | CrWC | — |
| Critical separation load (N) | 58 | 64 | 50 | 50 | 52 | 48 | 38 | 40 | 25 |

As indicated in table 7, it is understood that even the ground layer formation treatment performed without using the vacuum batch processing (except example 25) is capable of sufficiently improving the adhesiveness of the amorphous carbon film to the surface of the base material.

INDUSTRIAL APPLICABILITY

The method of the present invention for forming the amorphous carbon film is capable of forming the amorphous carbon film on the surface of the base material at a low cost, even though the degree of vacuum inside the chamber is low in a range of 1000 to 30000 Pa. Therefore the film formation method can be utilized to form films for various members such as large mechanical parts, dies, and the like.

EXPLANATION OF REFERENCE SYMBOLS AND NUMERALS

1: chamber
2: base material
3: power source side electrode
4: grounding side electrode
5: Pirani gauge
6: power source for PBII apparatus
7: mass flow controller
8: vacuum pump
9: material gas bomb
10: noble gas bomb
11: Baratron gauge
12: gas introduction nozzle

The invention claimed is:

1. A method for forming an amorphous carbon film under a low vacuum by using a power source for a bipolar-type plasma-based ion implantation apparatus, wherein a power source side electrode connected to said power source for said plasma-based ion implantation apparatus and a grounding side electrode opposed to said power source side electrode are provided inside a chamber; a base material is disposed on one of said power source side electrode and said grounding side electrode; a degree of vacuum inside said chamber is set to 1000 to 30000 Pa; and plasma of a noble gas and that of a hydrocarbon-based gas are generated between said base material and said electrode where said base material is not disposed to form said amorphous carbon film on a surface of said base material.

2. A method for forming an amorphous carbon film according to claim 1, wherein said hydrocarbon-based gas is introduced between said electrodes through a nozzle provided inside said chamber.

3. A method for forming an amorphous carbon film according to claim 2, wherein said nozzle is disposed on a lateral surface disposed between said electrodes.

4. A method for forming an amorphous carbon film according to claim 2, wherein said nozzle is disposed inside said electrode where said base material is not disposed.

5. A method for forming an amorphous carbon film according to claim 1, wherein said noble gas consists of at least one kind selected from among helium and argon.

6. A method for forming an amorphous carbon film according to claim 1, wherein said hydrocarbon-based gas consists of at least one kind selected from among methane, acetylene, and toluene.

7. A method for forming an amorphous carbon film according to claim 1, wherein an introduction amount of said hydrocarbon-based gas is set to 1 to 50 sccm.

8. A method for forming an amorphous carbon film according to claim 1, wherein said surface of said base material is subjected to ground layer formation treatment before said amorphous carbon film is formed.

9. A method for forming an amorphous carbon film according to claim 8, wherein in said ground layer formation treatment, a metal layer is formed by carrying out vacuum batch processing.

10. A method for forming an amorphous carbon film according to claim 9, wherein said metal layer contains Cr and is formed by an unbalanced magnetron sputtering method.

11. A method for forming an amorphous carbon film according to claim 9, wherein said metal layer contains Si and is formed by using silane gas inside said chamber.

12. A method for forming an amorphous carbon film according to claim 8, wherein in said ground layer formation treatment, a film is formed by using polyalcohol derived from plants.

13. A method for forming an amorphous carbon film according to claim 12, wherein said polyalcohol derived from plants is chlorogenic acid, quinic acid, gallic acid or derivatives of said chlorogenic acid, said quinic acid, and said gallic acid.

14. A method for forming an amorphous carbon film according to claim 8, wherein said ground layer formation treatment is Cr plating treatment, tungsten carbide spray treatment or shot peening treatment.

15. A method for forming an amorphous carbon film according to claim 14, wherein said ground layer formation treatment is said shot peening treatment of spraying a shot material having a hardness equal to or more than that of the base material and particle diameters of 40 to 200 μm to said base material.

16. A method for forming an amorphous carbon film according to claim 1, wherein said base material consists of a cemented carbide material or a ferrous material.

17. An amorphous carbon film formed by carrying out a method for forming said amorphous carbon film according to claim 1.

18. An amorphous carbon film according to claim 17, having a thickness of 0.1 to 5.0 μm.

19. A method for forming an amorphous carbon film according to claim 1, wherein a distance D which is defined to be a distance between said base material and said electrode where said base material is not disposed is set to be 1 to 20 mm.

20. A method for forming an amorphous carbon film, according to claim 1, wherein an electric field which is defined to be a negative pulse voltage applied to said base material/a distance D is set to be 0.5 to 20 kV/cm, said distance being defined to be a distance between said base material and said electrode where said base material is not disposed.

* * * * *